United States Patent
Josephson

(10) Patent No.: US 7,323,915 B2
(45) Date of Patent: Jan. 29, 2008

(54) DELAY LOCKED LOOP WITH SELECTABLE DELAY

(75) Inventor: Jon E. Josephson, Minneapolis, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/335,749

(22) Filed: Jan. 19, 2006

(65) Prior Publication Data

US 2007/0164800 A1 Jul. 19, 2007

(51) Int. Cl.
*H03L 7/06* (2006.01)
(52) U.S. Cl. .................................. 327/149; 327/158
(58) Field of Classification Search ............... 327/149, 327/153, 156, 158, 161, 162, 163, 263, 276; 331/17, 25; 375/373–376
See application file for complete search history.

(56) References Cited

U.S. PATENT DOCUMENTS

| | | | |
|---|---|---|---|
| 4,479,091 A | 10/1984 | Yoshisato | 331/17 |
| 5,488,641 A | 1/1996 | Ozkan | 375/374 |
| 5,940,609 A | 8/1999 | Harrison | 395/558 |
| 6,137,325 A | 10/2000 | Miller, Jr. | 327/156 |
| 6,256,362 B1 | 7/2001 | Goldman | 375/373 |
| 6,441,691 B1 | 8/2002 | Jones et al. | 331/25 |
| 6,448,826 B1 * | 9/2002 | Ooishi et al. | 327/158 |
| 6,683,930 B1 | 1/2004 | Dalmia | 375/376 |
| 6,777,990 B2 * | 8/2004 | Partsch et al. | 327/149 |
| 6,856,202 B2 | 2/2005 | Lesso | 331/1 A |
| 2006/0109943 A1 * | 5/2006 | Nguyen et al. | 375/376 |

OTHER PUBLICATIONS

U.S. Appl. No. 11/254,281, filed Oct. 20, 2005, Jeffrey J. Kriz.
U.S. Appl. No. 11/254,569, filed Oct. 20, 2005, James D. Seefeldt et al.
U.S. Appl. No. 11/254,474, filed Oct. 20, 2005, James D. Seefeldt.
U.S. Appl. No. 11/254,466, filed Oct. 20, 2005, James D. Seefeldt.
U.S. Appl. No. 11/342,106, filed Jan. 27, 2006, Mark D. Dvorak et al.
Dong Pan, et al, "A Radiation-Hard Phase-Locked Loop," IEEE 2003, pp. 1-6.
European Search Report dated Apr. 16, 2007.

* cited by examiner

*Primary Examiner*—Linh My Nguyen
(74) *Attorney, Agent, or Firm*—McDonnell Boehnen Hulbert & Berghoff LLP

(57) ABSTRACT

A DLL includes a control module coupled with a phase detect signal. The phase detect signal is used by a control module to generate feedback and output select signals. The feedback and output select signals are each coupled to a multiplexer. Each multiplexer is coupled to a Multi-Tap Delay Line (MTDL). The MTDL provides a plurality of delayed signals that are selectable by the two multiplexers. The first multiplexer, coupled to the feedback select signal, selects a feedback clock signal. The second multiplexer, coupled to the output select signal, select a DLL output signal. The control module may receive other signals, such as a delay select signal, that may be used to program or set the delay of the output signal. In addition, a plurality of output signals may be available from the DLL.

19 Claims, 9 Drawing Sheets

DELAY LOCKED LOOP WITH SELECTABLE DELAY

GOVERNMENT RIGHTS

The United States Government has acquired certain rights in this invention pursuant to Contract No. DTRA01-03-D-00018 and Delivery No. DTRA01-03-D-0018-0003 awarded by the Defense Threat Reduction Agency.

FIELD

The present invention relates generally to a delay locked loop, and more particularly, a delay locked loop with a selectable delay.

BACKGROUND

Synchronous systems often employ Phase Locked Loops (PLLs) and Delay Locked Loops (DLLs) in order to synchronize an internal clock signal to an external clock signal. PLLs, as the name implies, synchronize an output signal with an external signal. A PLL receives the external signal as an input signal and generates the output signal. The output signal is generated by a combination of elements that include a charge pump and a voltage controlled oscillator. The output signal, however, is not the same signal as the input signal. The output signal is a generated signal that is designed to have the same frequency (or multiple of the frequency) of the input signal.

DLLs, on the other hand, synchronize an output signal, by delaying an input signal. The output signal is a delayed version of the input signal. The input signal is delayed so that the output signal is at a desired phase. For example, an Application Specific Integrated Circuit (ASIC) may use a DLL so that it can synchronize an incoming data stream from a processor with the processor's associated clock signal. Often times, the data stream and the clock signal may not be received by the ASIC at the same time. The received clock, for example, may be a fraction of a period ahead of the received data stream (due to transmission delays). In order to process the data stream correctly, the ASIC may require that the received data stream and the clock be in phase. The ASIC may employ a DLL to delay the received clock signal so that it is delayed to be in phase with the data stream. However, in other ASIC designs, a phase difference, such as 90 degrees, may be desired. Circuits down stream may use such a phase difference to retime received data, for example.

One limitation to conventional DLLs is that they may offer only a limited number of available delay times or phases. For example, phase delay increments of a quarter phase may only be available to a given DLL. In addition, in conventional DLLs, increasing the number of delay increments may increase the overhead associated with the DLL (e.g., size, power consumption, etc.).

Conventional DLLs are also limited because they are not easily programmable. A circuit employing a DLL may have requirements for the phase, or delay of a signal that is application specific. For example, in the ASIC described above, the ASIC may need to be reprogrammed for a different application, the delay requirements of the ASIC may change, or a new DLL may need to be fabricated with a specific delay time.

Therefore, there is a need for an improved DLL.

SUMMARY

A delay locked loop (DLL) and a method of operation are presented.

In one example, a DLL includes a control module coupled with a phase detect signal. The control module uses the phase detect signal to generate feedback and output select signals. The feedback and output select signals are coupled with two multiplexers coupled with a Multi-Tap Delay Line (MTDL). The MTDL provides a plurality of delayed signals that are selectable by the two multiplexers. The delayed signals may represent different phases of a reference clock signal. The first multiplexer uses the feedback select signal to choose one delayed signal as a feedback clock signal. The second multiplexer uses the output select signal to choose one delayed signal as the DLL output signal.

In another example, the DLL is coupled with a π-phase detect signal, in order to prevent the DLL from locking onto the π-phase (or an odd multiple of the π-phase) of the feedback clock signal. The DLL may also produce a lock detect signal that may be used by internal and external circuits to the DLL to determine the accuracy of the output signal.

In a further example, the control module is programmable so that a user may set the delay or phase of the output signal. A delay select signal may be used to program the control module.

In even further examples, the phase detect, feedback select, and output select signals may include more than one component. These components may be phase components such as zero-phase and 2π-phase components. The zero-phase and 2π-phase components may be used by a logic circuit within the DLL to perform mathematical operations. These mathematical operations may provide any number of calculable output signal phases. In addition, inverters may be added to one or more output signals of the DLL to increase the number of available output signals having different phases.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

A delay locked loop (DLL) with a selectable delay is presented. The DLL may delay an input reference clock signal in a variety of methods. The delayed reference clock signal may be delayed so that a desired phase is achieved as an output signal of the DLL. In one example of delaying the reference clock signal, the DLL includes a control module that, in operation, uses a received phase detect signal to derive feedback and output select signals. The feedback and output select signals are used by two separate multiplexers (MUXes) coupled with a Multi-Tap Delay Line (MTDL) in order to select an appropriate feedback clock signal and output signal. The feedback clock signal is used by a phase detector to detect the phase difference between the feedback clock signal and the reference clock signal. The MTDL receives a reference clock signal and provides a plurality of delayed signals to both MUXes so that the MTDL may be "tapped" and thereby provide both the feedback clock signal and the output signal. The output signal is a delayed reference clock signal.

In a second example, the DLL may delay a reference signal by determining a delay time by using an input delay select signal. The delay select signal may also be coupled with the control module so that the output select signal output from the control module reflects a desired delay of the output signal. By using the delay select signal, the control module and thus the DLL is programmable for outputting a reference clock signal with a desired delay or phase.

In a third example, the select, offset, and feedback signals may comprise more than one component representing various phases of the reference signal. Using these different components, mathematical operations may be performed by a logic circuit in order to provide a plurality of output signals having different delays or phases.

Figure 1A:
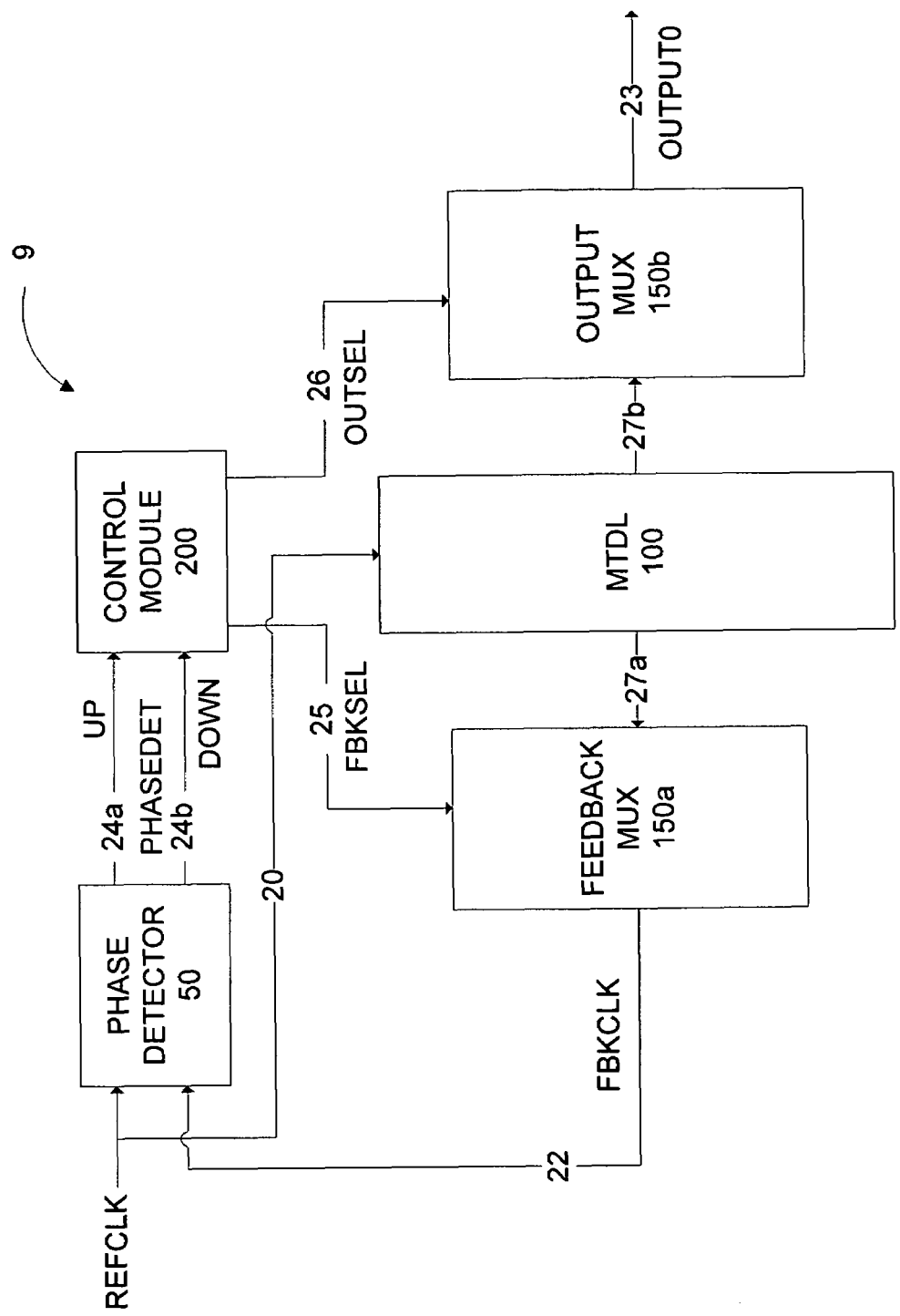
FIG. 1a is block diagram of a Delay Locked Loop (DLL)

Turning now to FIG. 1a, a DLL 9 receives a reference clock signal (REFCLK) and a feedback clock signal (FBKCLK) on respective signal lines 20 and 22. Output from the DLL 9 is an output signal (OUTPUT0) on signal line 23. Within DLL 9, REFCLK and FBKCLK are communicated to a phase detector 50. Phase detector 50 produces a phase detect signal (PHASEDET) on signal lines 24a and 24b. Signal lines 24a and 24b carry respective up and down components of PHASEDET.

Control module 200 is coupled to receive PHASEDET and produces a feedback select signal (FBKSEL) on signal line 25 and an output select (OUTSEL) signal on signal line 26. Feedback MUX150a, coupled with MTDL 100, receives FBKSEL and produces FBKCLK. Output MUX 150b, also coupled with MTDL 100, receives OUTSEL and produces OUTPUT0.

MTDL 100 is coupled with REFCLK and provides a plurality of delayed signals (i.e., delayed REFCLKs) to MUXes 150a and 150b. Signal lines 27a and 27b carry delayed REFCLK signals. Many delayed REFCLK signals are available on signal lines 27a and 27b. Each delayed REFCLK signal is coupled to MUXes 150a and 150b and may be selectable by MUXes 150a and 150b.

In operation, DLL 9 employs phase detector 50 in order to compare REFCLK and FBKCLK and determine if the two signals are in phase. Phase detector 50 output, PHASEDET, is a signal indication of whether REFCLK and FBKCLK are in phase, or whether REFCLK is ahead (leads) or behind (lags) FBKCLK. As described above, PHASEDET may comprise up and down components, as is shown in FIG. 1a. The up component may indicate that DLL 9 should increase the delay of FBKCLK and the down component may indicate that DLL 9 should decrease the delay FBKCLK.

In response to receiving PHASEDET, the control module 200 generates FBKSEL and OUTSEL so that MUXes 150a and 150b select an appropriate delayed REFCLK for FBKCLK and OUTPUT0. MUXes 150a and 150b may be conventional multiplexers, or some other type of logic circuitry used to select an appropriate signal from an array of available signals. In addition, FBKCLK and OUTPUT0, selected from MUXes 150a and 150b, are not necessarily the same. As DLL 9 monitors REFCLK, FBKCLK should be delayed so that it is in phase with REFCLK. OUTPUT0, however, may be a delayed representation of REFCLK.

The delay of OUTPUT0, in relation to REFCLK, may be application specific, or programmed into the control module 200. A delay select signal (DELAYSEL) may be used to program the control module so that it increases or decreases the value of OUTSEL. DELAYSEL may represent a programmed time by a user. MUX 150b will respectively select a longer or shorter delay time for REFCLK based on the programmed time. This programmable configuration offers a second way to delay REFCLK. DELAYSEL is described in further detail with respect to FIG. 1b.

Creating a delayed OUTPUT0 (i.e., a REFCLK that is at a different phase than its input) may be desirable as some applications may require a specific delay time for an input REFCLK. For example, a data processing circuit may use the DLL 9 so as to synchronize two different streams of incoming data. Both data streams may have the same frequency but are offset from each other by a known phase difference. The DLL 9 could be programmed and subsequently used to offset one of the data streams so that both of them are in sync with each other or at a desired phase difference.

As described above, the MTDL 100 may provide a plurality of delayed signals. Each delayed signal within the plurality of delayed signals is a delayed REFCLK. Some configuration may only use some of the output signals available from MTDL 100. If resolution is not as important for FBKCLK, signal line 27a, for example, may represent a 5-bit number. Signal line 27b, however, may represent a 7-bit number. Signals lines 27a and 27b may represent larger or smaller bit numbers.

The maximum resolution of the delay of the DLL 9 is set by the number of available delayed signals on signal lines 27a and 27b. For example, if MTDL 100 has 60 taps, 60 phases may be available. The 60 taps may be used to span a phase delay range of 0 to $3\pi$. Each tap in the MTDL 100 would then represent a phase delay of 9 degrees or $\pi/20$. By increasing the number of taps, the resolution can be increased or the span of the phase delay range may be increased. On the other hand, by decreasing the number of taps, the resolution may be subsequently decreased.

Figure 1B:
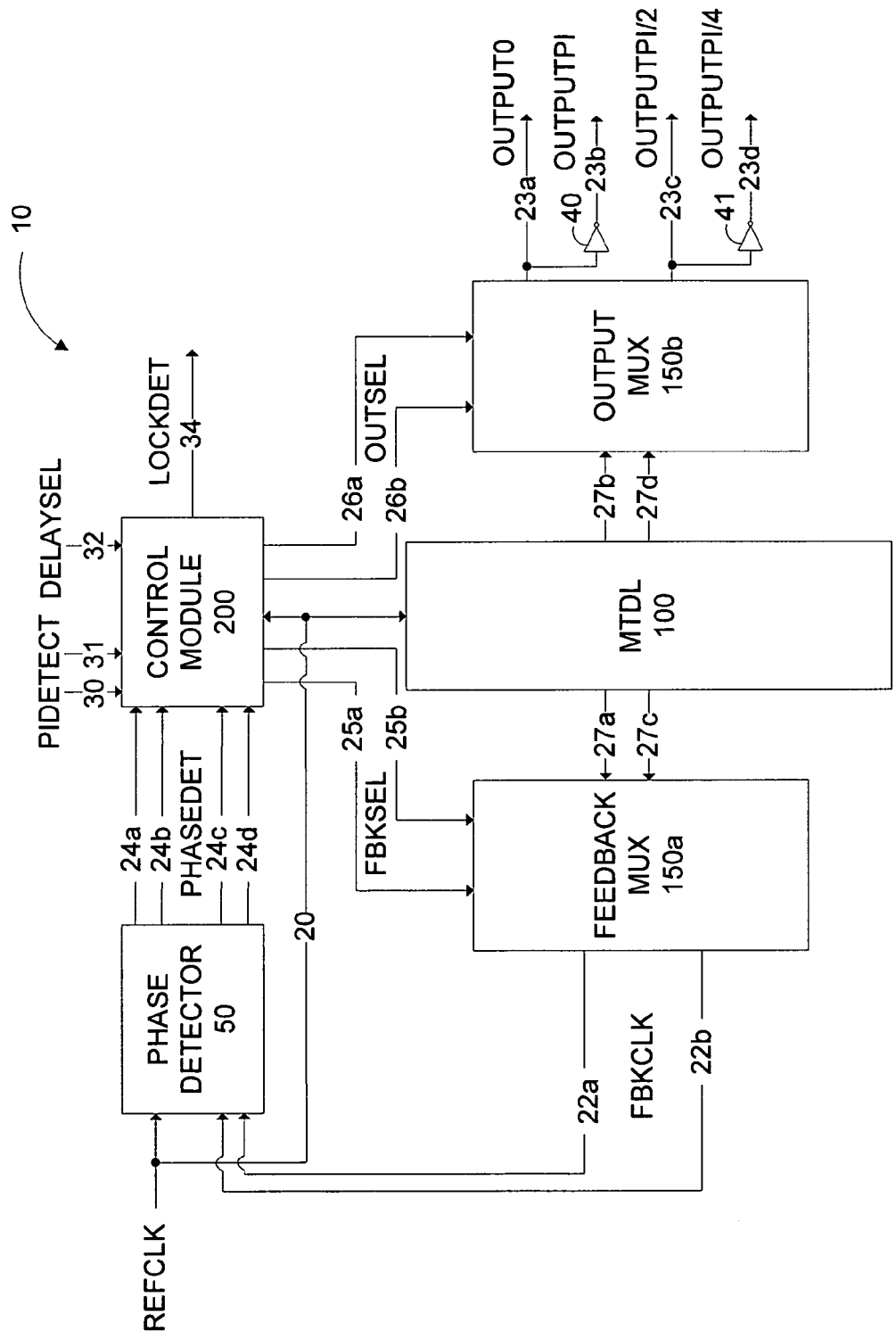
FIG. 1b is a block diagram of another DLL.

Alternative to the example DLL 9 in FIG. 1a, DLL 10 in FIG. 1b may also be used to delay REFCLK. The DLL 10 in this example maintains all of the components of DLL 9 (i.e., MUXes 150a and 150b, MTDL 100, control module 200); however, additional components to some of the signals are added. Also added are the signals $\pi$-detect (PIDETECT) on signal lines 30 and 31 and DELAYSEL on signal line 32. DLL 10 outputs a plurality of output signals (OUTPUT0, OUTPUTPI/2, OUTPUTPI, OUTPUT3PI/4), on signal lines 23a-d. The plurality of output signals provides a third way of delaying REFCLK. A user may select OUTPUTPI/2 as an output. OUTPUTPI/2 has a $\pi/2$ phase difference in comparison to REFCLK. In addition to the plurality of output signals, DLL 10 also outputs a lock detect signal (LOCKDET) on signal line 34.

Control module 200, in this example receives PHASEDET on signal lines 24a-d. Signal lines 24a-d carry several components of PHASEDET. Signal lines 24a and 24c carry up pulses and signal lines 24b and 24d carry down pulses.

Figure 6:
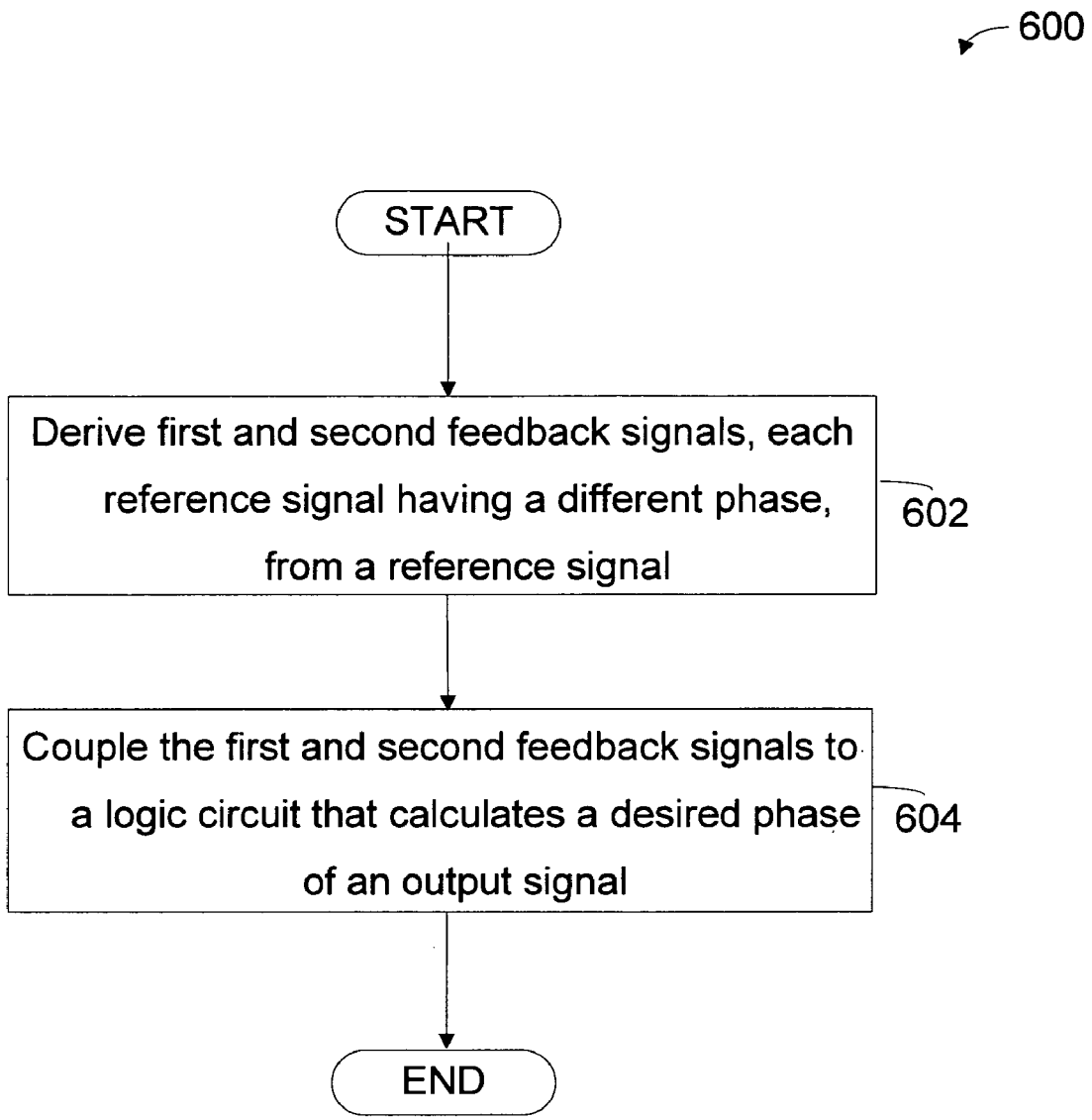
FIG. 6 is a block diagram of a method of calculating a phase of an output signal.

In addition, signal lines 24a and 24b carry a zero-phase component of PHASEDET and signal lines 24c and 24d carry a 2π-phase components PHASEDET. The zero-phase and 2π-phase components of PHASEDET, as well as other signals, are made available to the control module 200 so that the control module 200 may derive a desired phase component of OUTSEL. Deriving a desired phase component of OUTSEL is described with reference to FIG. 6.

The up and down components as well as the zero phase and 2π-phase components of PHASEDET may be viewed as distinct signals. In this respect, PHASEDET may be viewed as either a single phase detect signal or four distinct phase detect signals. PHASEDET may be a single multi-bit signal where a bit or several bits represent a component such as an up or down component. Alternatively, four distinct single-bit or multi-bit signals may make up PHASEDET. In even further examples, PHASEDET may comprise additional components to further characterize the delay, or phase, of REFCLK. Such characterization could include π/2 or π/4 phase components of PHASEDET.

Figure 2A:
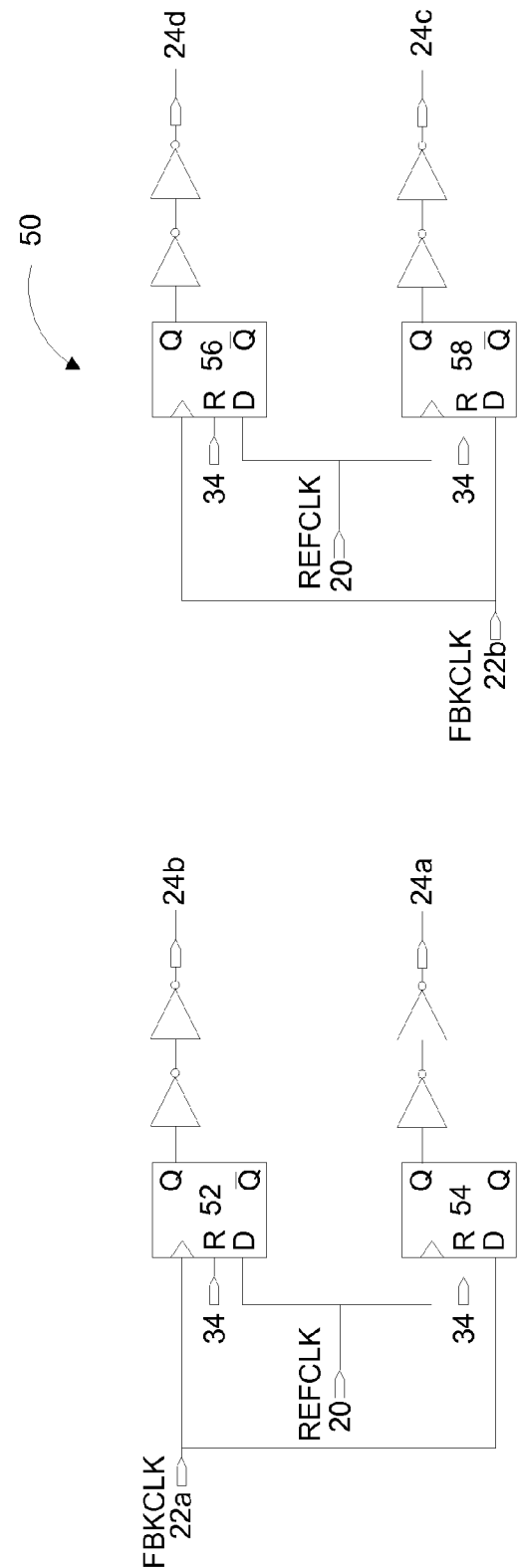
FIG. 2a is a circuit diagram of a phase detector.

In order to generate PHASEDET, phase detector 50 may comprise a variety of logic circuits to evaluate REFLCK and FBKCLK. In FIG. 2a, two logic circuits are used to create the phase detector 50. In this example, D flip-flops 52 and 54 are coupled with FBKCLK and REFCLK on respective signal lines 20 and 22a. Both of these flip-flops output the zero-phase up and down components of PHASEDET on signal lines 24a and 24b. D flip-flop 52 tracks REFCLK and FBKCLK and evaluates whether REFCLK is ahead of FBKCLK. D flip-flop 52 goes "high" to indicate that REFLCK is ahead of FBKCLK. In contrast, D flip-flop 54 tracks REFCLK and FBKCLK and it goes "high" when FBKCLK is ahead of REFCLK. The outputs of D flip-flops 52 and 54 may be coupled with buffers so as to adjust PHASEDET on signal lines 24a and 24b.

D flip-flops 56 and 58, on the other hand, output the 2π-phase up and down components of PHASEDET on signal lines 24c and 24d. D flip-flops 56 and 58 are coupled with FBKCLK and REFCLK on signal lines 20 and 22b respectively. When D flip-flop 56 goes "high", REFCLK is ahead of FBKCLK. When D flip-flop 58 goes "high", FBKCLK is ahead of REFCLK.

As mentioned above, many different configurations of logic circuits may be arranged in order to create a phase detector 50. A radiation hardened phase detector 50 may be created by adding redundant D flip-flops to the example phase detector 50 in FIG. 2a. These additional D flip-flops may be coupled with D flip-flops 52-58 so that they are in a voter configuration. A voter configuration of D flip-flops 52-58 would only allow up and down components of the zero and 2π phase components of the phase signal to be generated when the majority of redundant D flip-flops "agree" on the correct output signal. If a radiation event, such as a Single Event Upset (SEU), were to occur at one of these redundant flip-flops, an erroneous phase signal could be prevented by not allowing the phase signal to transition until all of the redundant D flip-flops are in agreement.

Returning to FIG. 1b, in addition to receiving PHASE-DET, control module 200 is also coupled to receive PIDE-TECT and DELAYSEL. PIDETECT allows the control module 200, and the DLL 10, to detect when FBKCLK is locked onto the π-phase, or an odd multiple of the π-phase of REFCLK. Utilizing PIDETECT prevents the control module 200 from locking onto REFCLK at its π-phase. Without PIDETECT, the DLL 10 may not send up or down components of PHASEDET when it is locked onto the π-phase of REFLCK. In the example of FIG. 1b, PIDETECT has two components, a zero-phase component on signal line 30 and a 2π-phase component on signal line 31.

Figure 2B:
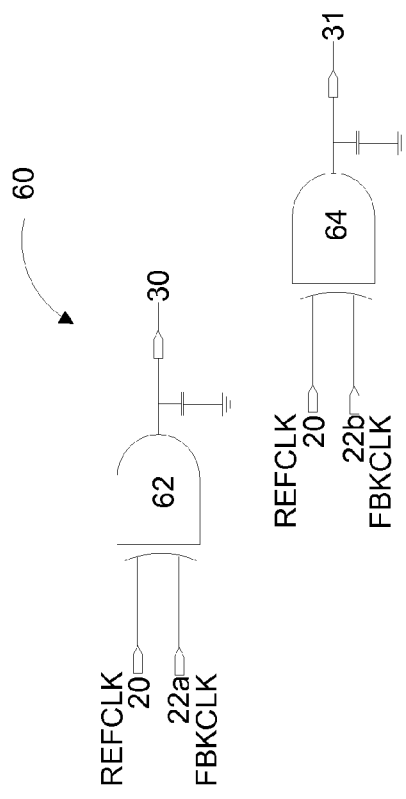
FIG. 2b is a circuit diagram of a circuit used to generate π-phase detect signals.

A circuit 60 for generating PIDETECT is illustrated in FIG. 2b. Two XOR logic gates 62 and 64 are coupled with FBKCLK and RFCLK. XOR gate 62 is coupled with signal lines 20 and 22a and produces the zero-phase component of PIDETECT on signal line 30. XOR gate 64 is coupled with signal lines 20 and 22b and produces the 2π-phase component of PIDETECT on signal line 31. In operation, when REFCLK and FBKCLK are out of phase, the zero-phase and 2π-phase component of PIDETECT on respective signal lines 30 and 31 go "high". Circuit 60 may be included in the phase detector 50 or in another component of the DLL 10, such as the control module 200. In some examples, PIDE-TECT may have a margin of phase tolerance. That is, when FBKCLK is in the region of, or a few degrees out of the π-phase of REFCLK, it still may, nevertheless, indicate that it is locked onto the π-phase.

Returning again to FIG. 1b, DELAYSEL, as described above, is used to determine the phase offset, or delay of OUTSEL. DELAYSEL may be a multi-bit signal that is added to FBKSEL so as to produce OUTSEL. In other examples, DELAYSEL could be sent from other circuitry, or programmable by way of a dip switch. A user could input the DELAYSEL by setting the dip pins on the dip switch for the appropriate delay. Many other types of software, or hardware could be implemented so as to provide DELAYSEL.

Also shown as output from the control module 200 is LOCKDET on signal line 34. LOCKDET is coupled with internal circuitry within DLL 10 and/or external circuitry to provide status information as to whether or not OUTPUT0 is locked onto REFCLK. If a lock is detected, the OUTPUT0 (as well as OUTPUTPI/2, OUTPUTPI, and OUTPUT3PI/4) may be viewed as accurate and that OUTPUT0 is at a correct or desired phase. In alternative examples, the LOCKDET may be output from other modules within the DLL 10, such as MUX 150b.

In FIG. 1b, signal lines 22a and 22b respectively carry the zero-phase and 2π-phase components of the FBKSEL signal. Signal lines 22a and 22b respectively carry the zero and 2π-phase components of FBKCLK. Signal lines 26a and 26b respectively carry the zero and π/2-phase components of OUTSEL. Signal lines 27a and 27b carry zero-phase components of delayed REFCLKs output from the MTDL 100. Signal lines 27c and 27d respectively carry the 2π-phase and π/2-phase components of delayed REFCLKs.

The illustrated example of FIG. 1b may be reconfigured to include various combinations of the signals within DLL 9 or 10 in order to achieve a desired output. The illustrated examples in FIGS. 1a and 1b should not be viewed as limited to only those examples. Many of the signal paths may also be combined with delay buffers or inverters to optimize OUTPUT0, OUTPUTPI/2, OUTPUTPI, and OUTPUT3PI/4.

Figure 3A:
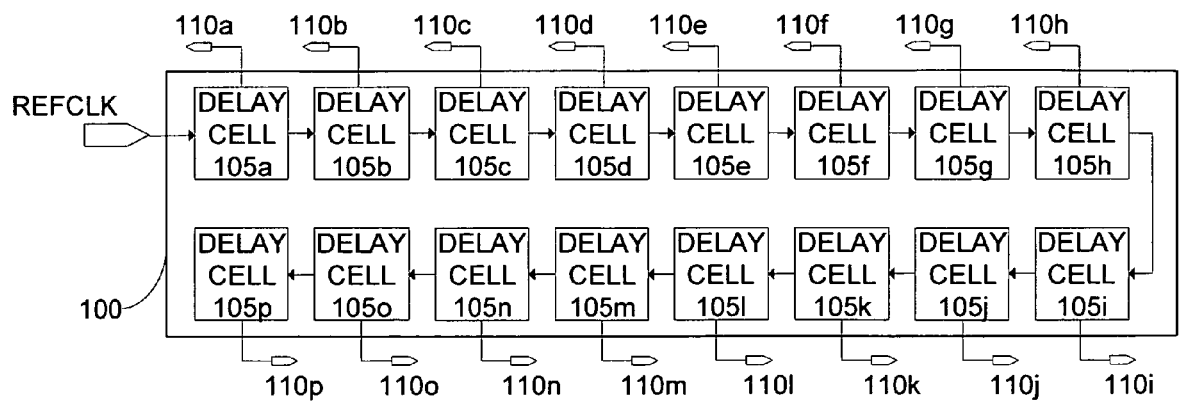
FIG. 3a is a block diagram of a Multi-Tap Delay Line (MTDL)

The MTDL 100 and MUXes 150a and 150b use the respective zero and 2π-phase components of OUTSEL and the zero and π/2-phase components of OUTSEL in order to generate FBKCLK, OUTPUT0, and OUTPUTPI/2. An example MTDL 100 is illustrated in FIG. 3a. The MTDL 100 includes a series of delay cells 105a-p. REFCLK is input into the MTDL 100 and taps 150a-p output delayed REFCLKs. Each delay cell has an input and at least one output. The delay cells 105a-p are each coupled to receive a clock signal. For example, delay cell 105a is coupled to receive REFCLK. Delay cell 105b, on the other hand, is coupled to receive an output from delay cell 105a. Delay cells 105*a-p* provide as output the respective taps 110*a*-110*p*. Taps 10*a-d* are coupled with MUXes 150*a* and 150*b* via signal lines 27*a-d*.

In operation, when the MTDL 100 receives REFCLK, the signal is delayed by delay cell 105*a*. The amount of delay is determinable by the design of the delay cells within MTDL 100. The delayed REFCLK is available at tap 110*a* and it is also sent to delay cell 105*b*. In the same manner, delay cell 105*b* delays the delayed signal even further. The further delayed signal is available at tap 110*b* and it is sent to delay cell 105*c*. A plurality of delay signals becomes available by adding delay cells. In the example of FIG. 3*a*, sixteen delay cells are shown. Depending on the application, however, a larger or smaller number of delay cells may be implemented. For example, a larger number of delay cells may be used to provide available phase delays in the range of zero to $3\pi$.

In FIG. 3*a*, REFLCK is shown coupled to the MTDL 100; in other configurations, however, other input clocks signals may be used. The MTDL 100 is not limited to only receiving the REFCLK. Also, various buffers or delay elements may be used to couple the REFCLK or other input clock signals with the MTDL 100.

Figure 3B:
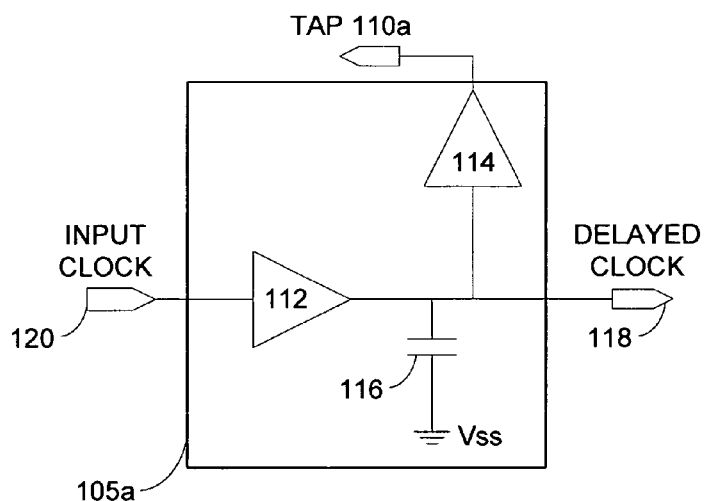
FIG. 3b is a circuit diagram of a delay cell.

An example delay cell 105*a* is illustrated in FIG. 3*b*. Delay cell 105*a* comprises buffer delays 112, 114 and capacitor 116. In some examples, capacitor 116 may be an intrinsic parasitic capacitance or a discrete component, for example. Buffer delay 112 has an output coupled with inputs of buffer delay 114, capacitor 116, and output 118. Buffer delay 114 has an output coupled with tap 110*a*. Capacitor 116 is coupled with Vss.

An input clock signal (i.e., REFCLK) is input at input 120. Buffer delay 112 delays the input clock signal and outputs the signal to buffer delay 114. The delayed clock signal is output at tap 110*a*. The delayed signal from buffer delay 112 is also sent to output 118, so that it may be further delayed by a subsequent delay cell.

Many other types of delay cells may be used in the MTDL 100. A delay cell with a different configuration of delay buffers or capacitors could be implemented. Alternatively, different circuit elements, such as those found in conventional digital circuits could be used to delay REFCLK.

Figure 4:
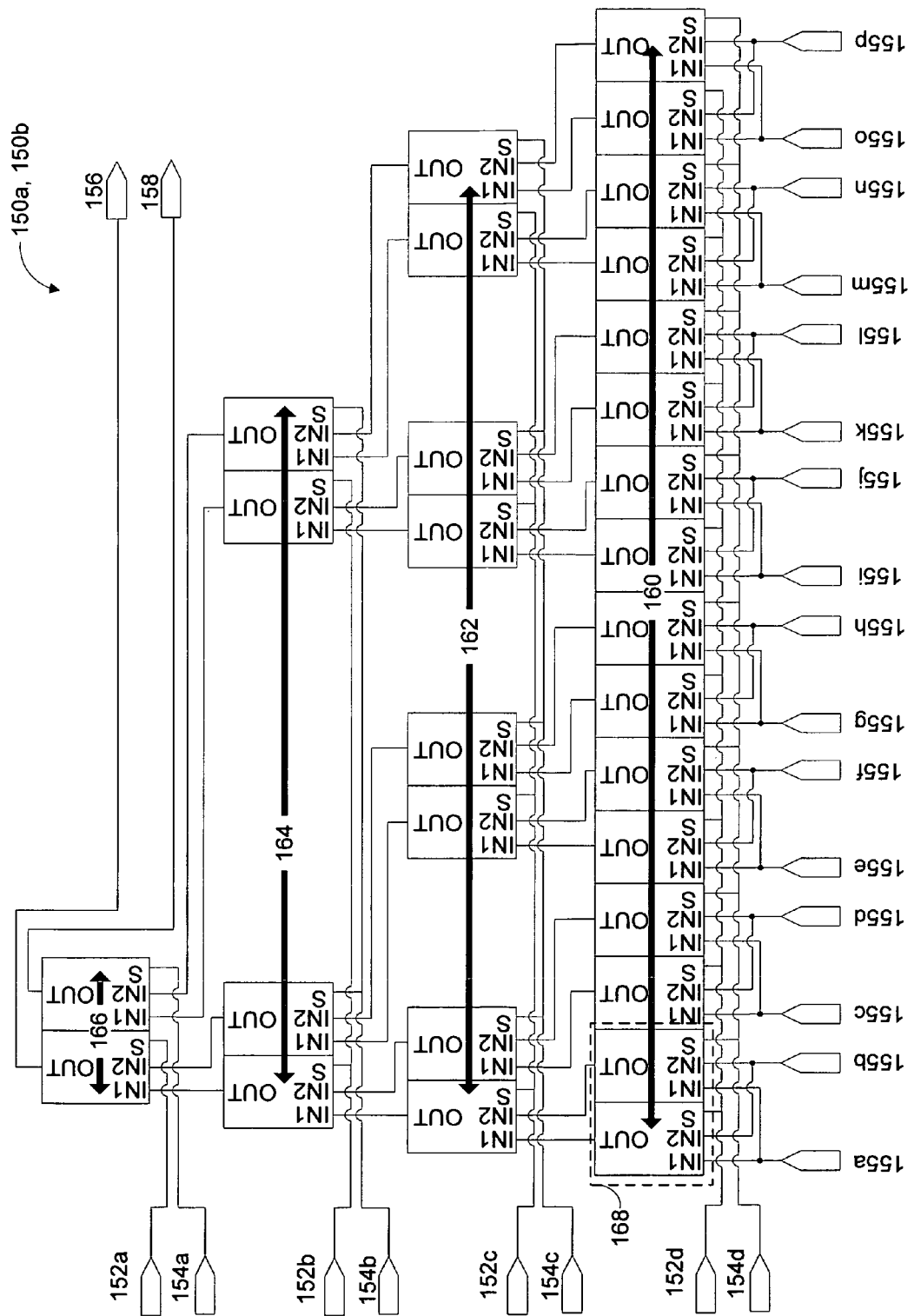
FIG. 4 is a circuit diagram of a multiplexer.

Once the delayed REFCLKs have been derived, MUXes 150*a* and 150*b* are then used to select delayed REFCLKs. An example MUX 150*a*, 150*b* is illustrated in FIG. 4. MUX 150*a*, 150*b* is coupled to receive MTDL 100 output signals 110*a-p* (i.e., via signal lines 27*a-d*). In addition, MUX 150*a*, 150*b* also receives input signals 152 and 154 which are distributed into binary components 152*a-d* and 154*a-d* respectively. Output from MUX 150*a*, 150*b* are outputs 156 and 158. A first input signal on signal line 152 is used to select one phase component of the delayed REFCLK (i.e., zero-phase) at output 156. A second input signal on signal line 154 is used to select the phase component (i.e., $\pi/2$ or $2\pi$) of the delayed REFCLK at output 158.

MUXes 150*a*, 150*b* include 4 arrays of 2×1 MUXes, 160-166. Each 2×1 MUX receives two input signals and a MUX select signal. The MUX select signal is used to select one of the two input signals as an output signal.

The first array of MUXes 160 is coupled to receive MTDL 100 outputs 110*a-p* as inputs. The least significant binary digit of the signal lines 152 and 154, (i.e., 152*d*, 154*d*) is coupled to the MUX select inputs of the first array 160. For example, a first pair of 2×1 MUXes 168 each receive MTDL 100 outputs 110*a* and 110*b* as input. The signal at input 152*d* is used by the first 2×1 MUX in the pair to select a first output for the second array of MUXes 162. Signal 154*d* is used by the second 2×1 MUX in the pair to select a second output for the second array of MUXes 162.

In the example of FIG. 4, for output MUX 150*b*, input 152 may be used as the zero-phase component of OUTSEL. Input 154 may then be used as the $\pi/2$-phase component OUTSEL. Alternatively, for feedback MUX 150*a*, input 152 may be used as the zero-phase component of FBKSEL. Input 154 would then be used as the $2\pi$-phase component of FBKSEL.

The second array of MUXes 162 selects, via inputs 152*c* and 154*c*, outputs sent from the first array of MUXes 160. The third array of MUXes 164, in turn, selects, via inputs 152*b* and 154*b*, outputs sent from the second array of MUXes 162. The fourth array of MUXes 166 ultimately selects the output signal available at output 156 and 158 of MUX 150*a*, 150*b*.

Figure 5A:
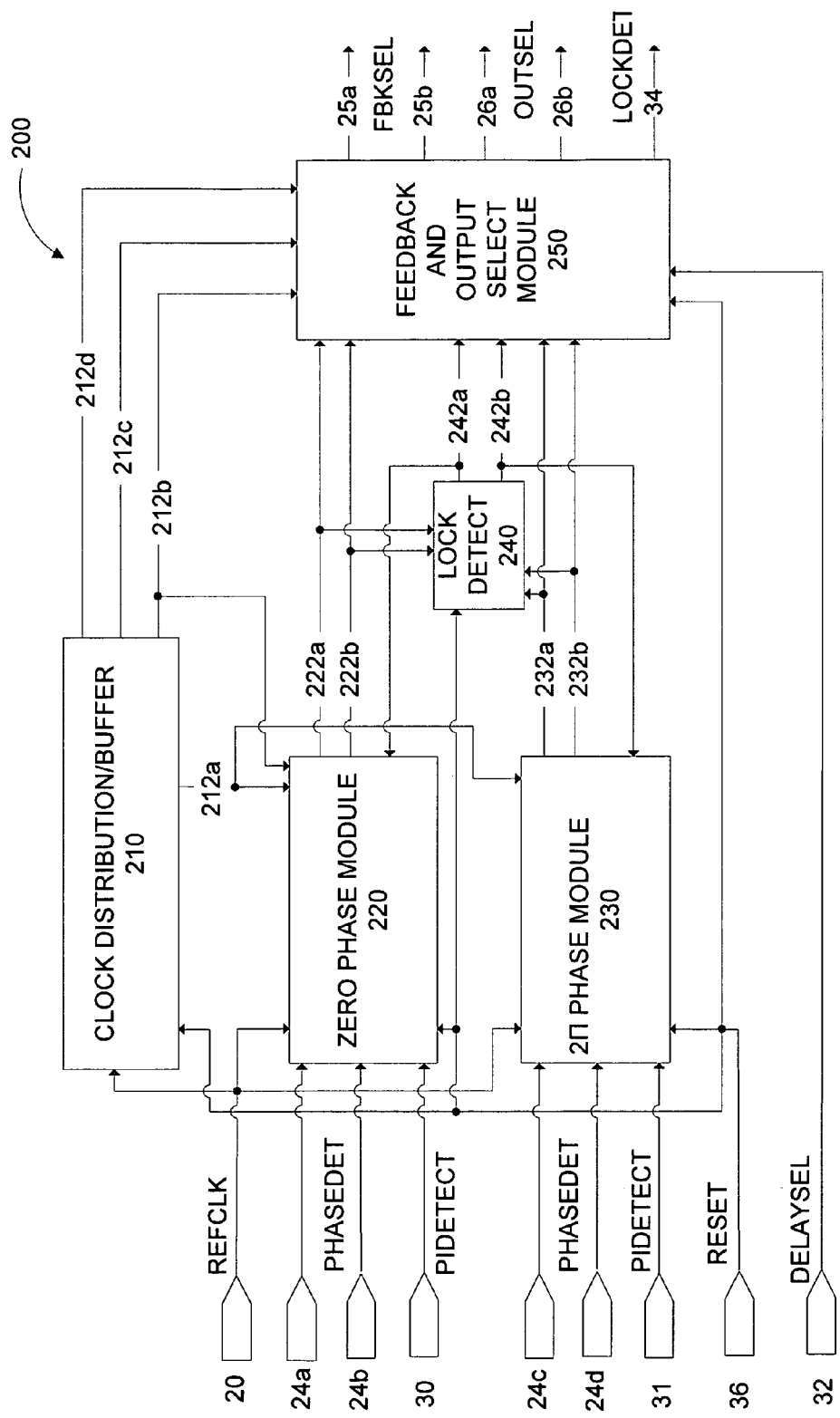
FIG. 5a is a block diagram of control module.

As described above MUX 150*a*, 150*b* may be coupled to FBKSEL or OUTSEL at inputs 152 and 154. In order to illustrate how FBKSEL and OUTSEL are generated, a block diagram of the control module 200 is illustrated in FIG. 5*a*. The control module 200 comprises a clock distribution/buffer module 210, zero-phase and $2\pi$-phase modules 220 and 230, lock detect 240, and feedback and output select module 250. All of the modules in this example are coupled with signal line 36, which provides a reset signal to all the modules. Signal line 36, although not shown in FIGS. 1*a* and 1*b*, may provide reset functionality via a reset signal (RESET) to either DLL 9 or 10.

The clock distribution/buffer 210 is coupled to receive REFCLK. Within clock distribution/buffer 210, is a series of interconnected D flip-flops, illustrated in FIG. 5*b*. The D flip-flops within the clock distribution/buffer 210 serve to divide a received clock signal by two. The D flip-flops thereby increase the period of REFCLK. As is shown in the example clock distribution/buffer 210 of FIG. 5*b*, each D flip-flop may be coupled with buffers or inverters in order to isolate REFCLK into derived clock signals. The arrangement and configuration of the buffers, inverters, and D flip-flops may depend on the frequency of the signals and the design parameters of the circuits used in the DLL 10. Output from the clock distribution/buffer 210 are four derived clock signals on signal lines 212*a-d*. More or fewer derived clock signals may be implemented depending on the configuration of a specific DLL.

Returning to FIG. 5*a*, the first derived clock signal on signal line 212*a* is coupled with the zero-phase and $2\pi$-phase modules 220 and 240. The second derived clock signal on signal line 212*b*, zero-phase lock detect signal on signal line 242*a*, PHASEDET on signal lines 24*a* and 24*b*, and PIDETECT on signal line 30 are coupled with the zero-phase module 220. $2\pi$-phase lock detect signal on signal line 242*b*, PHASEDET on signal lines 24*c* and 24*d* and PIDETECT on signal line 31 are coupled with the $2\pi$-phase module 230.

Figure 5B:
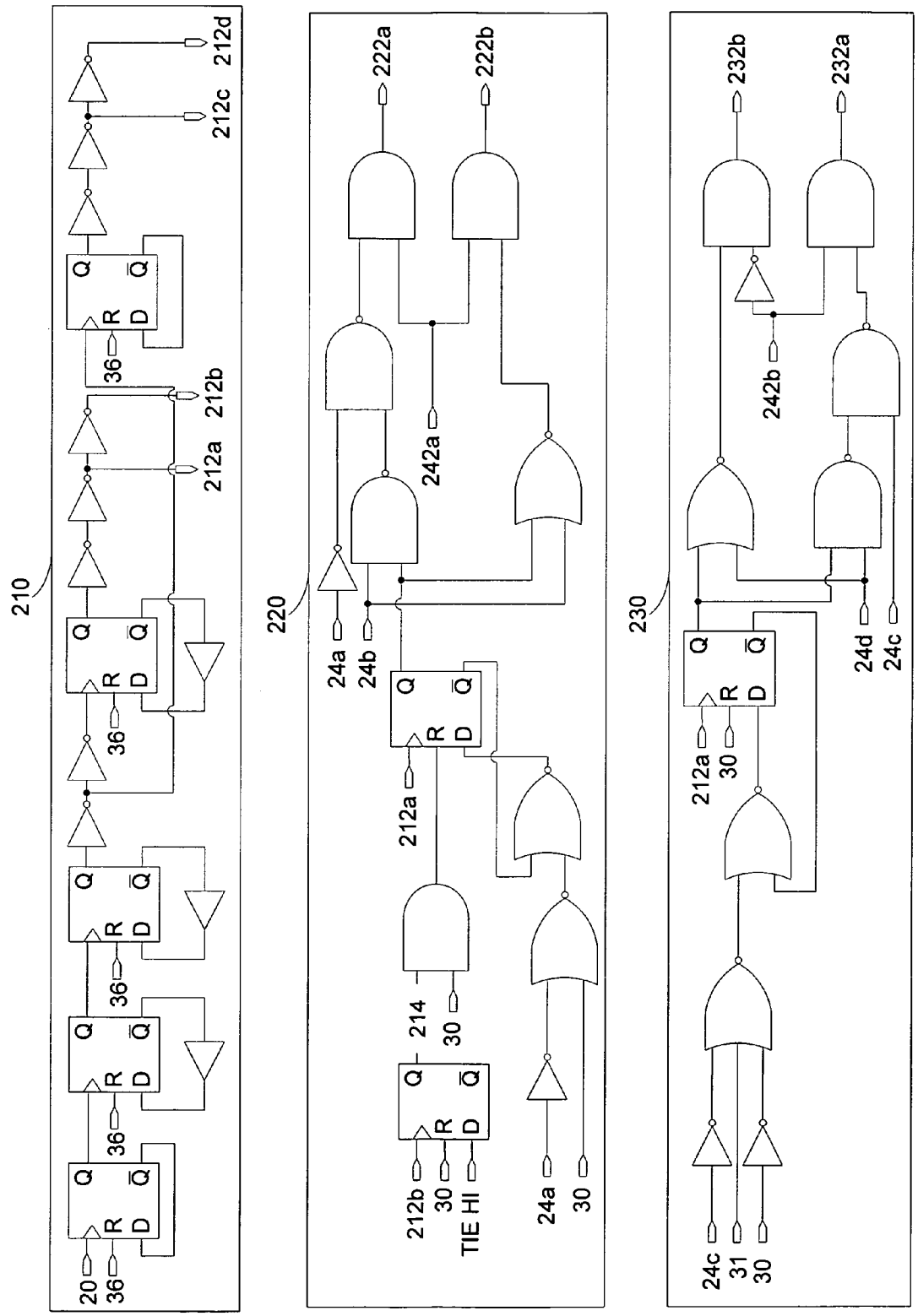
FIG. 5b is a circuit diagram of a clock distribution buffer, a zero-phase module, and 2π-phase module.

FIG. 5*b* shows a logic diagram of both the zero-phase and $2\pi$-phase modules 220 and 230. Similar to the clock distribution/buffer 210, the zero-phase module 220 uses D flip-flops and logic gates in order to transform the received up and down components of the zero-phase components of PHASEDET on signal lines 24*a* and 24*b* into up and down output signals at outputs 222*a* and 222*b*. The logic and D flip-flops are configured to evaluate the received zero-phase PHASEDET components, the zero-phase lock detect signal on signal line 242*a*, along with PIDETECT on signal line 30. This configuration determines if the DLL 9 or 10 should send up pulses when PIDETECT indicates that the DLL 9 or 10 is locked on a $\pi$-phase (or an odd multiple of the $\pi$-phase) of REFCLK. For example, the output of the phase detector

50 may indicate that no up or down zero-phase components of PHASEDET are required. However, PIDETECT on signal line 30 may indicate that the DLL 10 is locked on a π-phase of REFCLK. Signal line 222*a* will carry an up signal despite no zero-phase up component of PHASEDET being present. This ultimately allows the DLL 10 to continue to cycle through MTDL 100 until the appropriate delayed REFCLK is selected.

Also shown in FIG. 5*b* is a logic diagram of the 2π-phase module 230. Similar to the logic diagram of the zero-phase module 220, the 2π-phase module 230 uses PIDETECT on signal lines 30 and 31 to determine if an output up pulse should be generated. Outputs 232*a* and 232*b* carry respective up and down 2π-phase components of PHASEDET. In alternative examples, the zero-phase and 2π-phase modules 220 and 230 may comprise additional logic to evaluate other conditions present in a DLL, such as fast and slow up and down pulses. In this type of implementation, a DLL could slow down or speed up its response based on the magnitude of the up and down components of the PHASEDET received by the control module 200. In even further examples, clock distribution/buffer 210, the zero-phase and 2π-phase modules 220 and 230 may be located in other components of the DLL. The zero-phase and 2π-phase modules 220 and 230 may be located in the phase detector 50, for example.

Returning again to FIG. 5*a*, signal lines 222*a*, 222*b*, 232*a*, and 232*b* are coupled with lock detect module 240 and feedback and select module 250. Lock detect 240 determines if the signals received from the zero-phase and 2π-phase modules 220 and 230 are locked. Lock detect 240 outputs zero-phase and 2π-phase lock detect signals on signal lines 242*a* and 242*b*. In order to detect a lock condition, lock detect 240 may comprise circuitry that determines if up and down components of the signals generated from the zero-phase and 2π-phase modules 220 and 230 are changing or are staying in a steady state. The circuitry may also determine if either of modules 220 or 230 has changed states after a predetermined amount of time before generating the zero-phase and 2π-phase lock detect signals on signal lines 242*a* and 242*b*.

Feedback and output select module 250 is coupled with signal lines 242*a* and 242*b* as well as signal lines 222*a*, 222*b*, 232*a*, and 232*b*. It also receives DELAYSEL on signal line 32 as well as derived clock signals on signal lines 212*b*-*d*. Depending on the configuration of DLL 10, more or fewer signal lines may be coupled with the feedback and select module 250. Feedback and select module 250 outputs OFFSEL on signal lines 25*a* and 25*b* and OUTSEL on signal lines 26*a* and 26*b*.

Figure 5C:
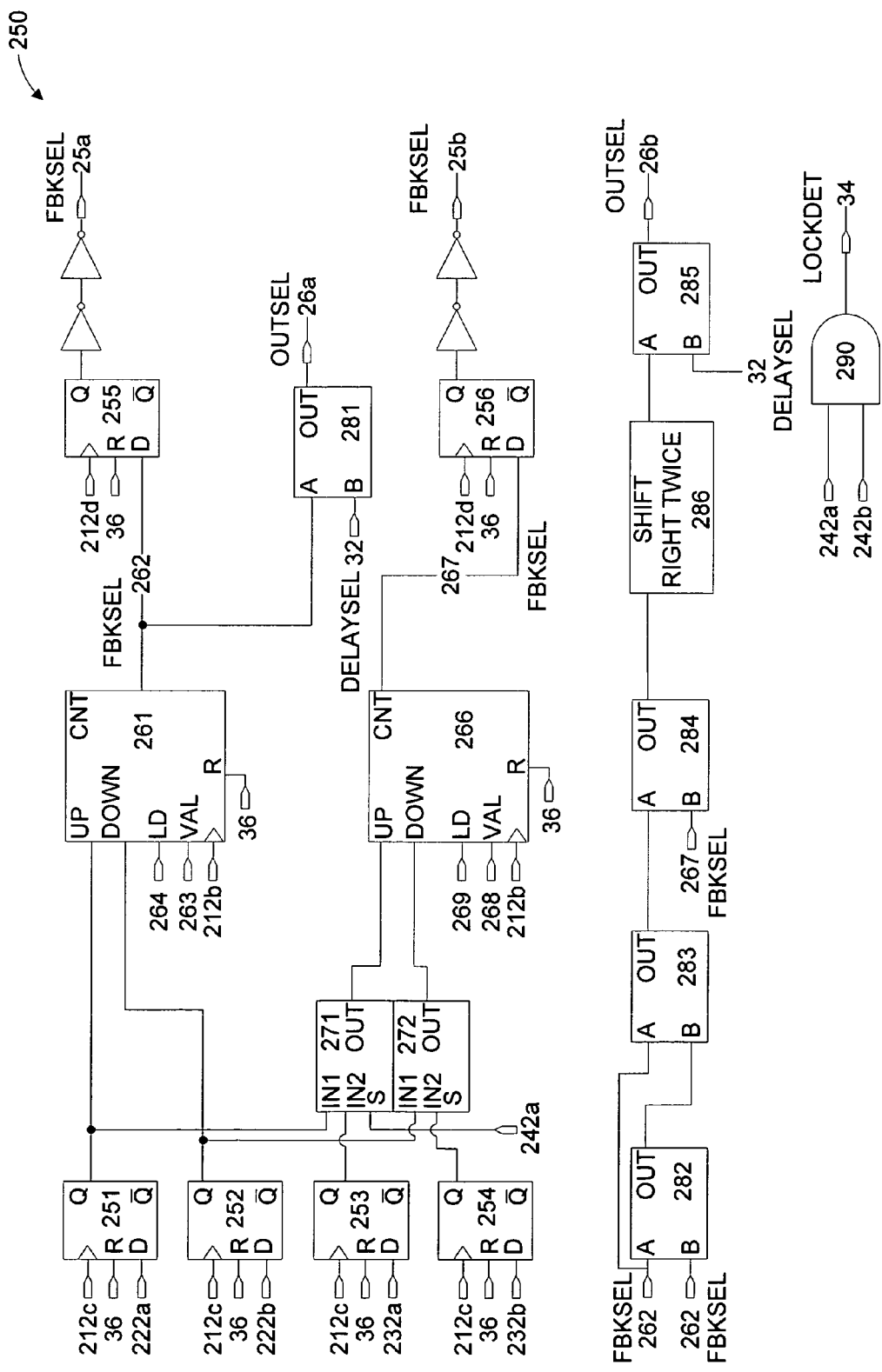
FIG. 5c is a circuit diagram of a feedback and output select module.

A circuit diagram of feedback and select module 250 is illustrated in FIG. 5*c*. Feedback and output select module 250 comprises D flip-flops 251-256, counters 261 and 266, 2×1 MUXes 271 and 272, adders 281-285, and a shift-right-twice register 286. A logical AND gate 290 may also be used to provide LOCKDET, which is output from feedback and output select module 250.

In operation, the feedback and output select module 250 uses D flip-flops 251-254 to sample input phase signals from signal lines 222*a*, 222*b*, 232*a*, and 232*b* from zero-phase and 2π-phase modules 220 and 230. The outputs from D flip-flops 251-252 are coupled with counter 261 which counts up and down based on the received signals from the zero-phase module 220. Counter 261 is coupled with signal line 212*b* in order to provide a clock signal to the counter. Counter 261 outputs the zero-phase component of FBKSEL on signal line 262. In the example of FIG. 5*c*, FBKSEL is also coupled with D flip-flop 254 and buffers/inverters in order to sample the zero-phase component of FBKSEL at a periodic interval of the derived clock signal on signal line 212*d*. A buffered version of the zero-phase component of FBKSEL is also output at output 25*a*. Again, as described above, various configuration of buffers and/or flip-flops may be provided to modify a signal so that it is compatible with other circuit components in the DLL 10.

In addition to counter 261 being coupled with D flip-flop 254, counter 261 is also coupled with a binary load input 263. Counter 261 may set an initial count via a signal at load input 264. Counter 261 is also coupled with adder 281 in order to create the zero-phase component of OUTSEL. Essentially, FBKSEL is added to DELAYSEL to create the zero-phase component of OUTSEL at output 26*a*.

When the counter 261 receives up and down signals from D flip-flops 251 and 252, it increments or decrements the value of FBKSEL. For example, a received up signal from zero-phase module 220 (via D flip-flop 251), may indicate that a larger delay should be selected from MTDL 100. When an up signal is received, the counter 261 may increase FBKSEL by "1". Alternatively, a received down signal may decrease FBKSEL by "1".

The load input 264 is used to set the initial value of the counter 261. When DLL 10 starts up, it may need to decrease the counter 261 so that FBKCLK can lock on to REFCLK. By loading an initial value at input 263, the counter 261 can be decremented instead of being pinned at its lowest storable value. If counter 261 is a 5 bit counter, for example, an initial value of "00011" may be stored at input 263 and it may be subsequently loaded at the startup of DLL 10 by inputting a load signal at load input 264. The zero-phase component of FBKSEL would have the value of "3" and it would be used by Feedback MUX 150*a* to select the third delayed REFCLK from MTDL 100 of the zero-phase component of FBKCLK.

As described above, the zero-phase component of OUTSEL is output at adder 281. DELAYSEL may have a value of "00100", for example. A signal value of "01000" of the zero-phase component of FBKSEL would produce an output signal value of "01100" for the zero-phase component of OUTSEL on signal line 26*a*. The zero-phase component of OUTSEL would have the value of "12" and it would be used by Feedback MUX 150*b* to select the twelfth delayed REFCLK from MTDL 100 as OUTPUT0.

At initial start-up of the DLL 10, the control module 200*a* will first derive the zero-phase components of FBKSEL and OUTSEL. After the zero-phase components of FBKSEL and OUTSEL are calculated, the 2π-phase component of FBKSEL and the π/2 component of OUTSEL are calculated. This is carried out using 2×1 MUXes 271 and 272. MUXes 271 and 272 are coupled with the zero-phase of the lock detect signal on signal line 242*a*. Counter 266 will count in the same manner of 261, initially using the signals sent from D flip-flops 251 and 252. This will pre-set the output of the counter 266 which outputs the 2π-phase component of FBKSEL on signal line 267. When the zero-phase component of the lock detect signal on signal line 242*a* is detected, however, MUXes 271 and 272 will select the 2π-phase up and down components output from D flip-flops 253 and 254. When the zero-phase component of the lock detect signal on signal line 242*a* indicates "lock", the counter 266 will continue to count up or down based on up and down signals that it receives. Signal lines 242*a* (as well as 242*b*) may also be coupled with AND gate 290 to produce LOCKDET at output 34. Additionally, in the same manner as counter 278, counter 275 may be loaded with an initial count value.

Similar to D flip-flop 255, D flip-flop 256 may be coupled with the 2π-phase component of FBKSEL in order to sample the 2π-phase component of FBKSEL at a periodic interval of the derived clock signal on signal line 212d. A buffered version of the 2π-phase component of FBKSEL is also output at output 25b. The 2π-phase component of FBKSEL is used by feedback MUX 150a to select a delayed REFCLK from MTDL 100 for the 2π-phase component of FBKCLK.

In contrast to FBKSEL, OUTSEL has a π/2-phase component instead of 2π-phase component. To calculate the π/2-phase component of OUTSEL mathematical operations via adders 282-285 and shift-right-twice register 286 are performed. The overall equation is as follows:

$$\phi\left(\frac{\pi}{2}\right) = \frac{(\phi(2\pi) + 3\phi(0))}{4}$$

Where $$\phi\left(\frac{\pi}{2}\right)$$

is the π/2 phase component of OUTSEL, φ(2π) is the 2π-phase component of FBKSEL and φ(0) the is zero-phase component of FBKSEL.

Using the mathematical, or algebraic, calculations via adders 282-285 and shift-right-twice register 286, the π/2-phase component of OUTSEL is available on signal line 26b. The π/2-phase component of OUTSEL is used by output MUX 150b to select a delayed REFCLK from MTDL 100 for the π/2-phase component of OUTPUTPI/2.

In addition to deriving the π/2-phase component of OUTSEL, any phase component may be calculated for OUTSEL by using a variety of logic circuit configurations. A method of deriving a phase component of OUTSEL is illustrated in the flow diagram of FIG. 6. At block 602, at least two feedback signals, having different phases, are derived from a reference signal. This is performed in DLL 10 by deriving the zero-phase and 2π-phase components of FBKCLK via phase detector 50, MTDL 100, MUX 150a and control module 200. Once the signals are derived a logic circuit may be used to calculate the desired phase of an output signal, as is shown at block 604. This output signal in DLL 10 is the π/2-phase component of OUTSEL. The logic circuit used to calculate the desired phase in the DLL 10 includes adders 282-285 and shift-right-twice register 286.

An example calculation performed by adders 282-285 and shift-right-twice register 286 is performed as follows. The zero-phase component of FBKSEL on signal line 262 may have a value of "1100", or 12. Adder 282 has both of its inputs coupled with signal line 262 and it produces "1000" as an output. The output of adder 283 is subsequently added to the zero-phase component of FBKSEL by adder 284 and produces "100100", or 36, as an output. This signal is then added to the 2π-phase component of FBKSEL. If, in this example, the 2π-phase of FBKSEL has a value of "110000", or 48, the output of adder 285 would be "1010100", or 84. Shift-right-twice register 286 then shifts its input signal two times to the right and produces "10101", or 21, as an output. DELAYSEL is added to the output of shift-right-twice register 286 at adder 285.

Many alternative configurations may be used to provide the algebraic calculation of the π/2-phase component of OUTSEL. In addition, the adders 281-285 and shift-right-twice register 286 may be optimized. The shift-right-twice register 286, for example, may be optimized to round up or down so that the least significant bits in the shift-right-twice operation are not lost.

Providing the π/2-phase of the select signal allows the DLL 10 to provide OUTPUTPI/2 and OUTPUT3PI/4 at outputs 23c and 23d. For example, in FIG. 1b, OUTPUT0 may be in sync with REFCLK. OUTPUTPI/2, however, may provide a π/2-phase delayed REFCLK signal. Inverters 40 and 41, as shown in FIG. 1b, may be coupled with OUTPUT0 and OUTPUT3PI/4 so as to provide π-phase and 3π/4 phase-delayed REFCLKs.

Overall, the above examples illustrate three ways of selecting a delay of an output signal in a DLL. The selected delay may be used to create a desired phase for a reference clock signal. One example uses the MTDL 100 to provide feedback and output MUXes 150a and 150b with a plurality of delayed REFCLKs. In another example, DELAYSEL is used to delay the zero-phase and π/2-phase components of OUTSEL. DELAYSEL ultimately delays the delayed REFCLK selected by output MUX 150b. The third example outputs multiple delayed REFCLKs (i.e., OUTPUT0, OUTPUTPI/2, OUTPUTPI, and OUTPUT3PI/4) at the DLL outputs 23a-d. In the example of FIG. 1b, all three examples are implemented. In the example of FIG. 1a, however, only the example using the MTDL 100 is employed. Alternative examples may use different combinations of these configurations in order to optimize a DLL. Therefore, it should be understood that the illustrated examples are examples only and should not be taken as limiting the scope of the present invention. The claims should not be read as limited to the described order or elements unless stated to that effect. Therefore, all examples that come within the scope and spirit of the following claims and equivalents thereto are claimed as the invention.

I claim:

1. A Delay Locked Loop (DLL), comprising:
a control module coupled to receive a phase detect signal, the control module deriving a feedback select signal and an output select signal based on the phase detect signal;
a Multi-Tap Delay Line (MTDL) coupled to receive a reference clock signal, the MTDL comprising a plurality of delay taps, each delay tap outputting a delayed reference clock signal, the MTDL, thereby, providing a plurality of delayed reference clock signals;
a first multiplexer coupled to receive the feedback select signal and the plurality of delayed reference clock signals, the first multiplexer selecting, via the feedback select signal, a first delayed reference clock signal from the plurality of delayed reference clock signals as a feedback clock signal;
a second multiplexer coupled to receive the output select signal and the plurality of delayed reference clock signals, the second multiplexer selecting, via the output select signal, a second delayed reference clock signal from the plurality of delayed reference clock signals as a first output signal; and
a phase detector coupled to receive the reference clock signal and the feedback clock signal, the phase detector deriving the phase detect signal by measuring a phase difference between the reference clock and feedback clock signals; wherein the phase detector comprises latches coupled together in a voting scheme so as to prevent Single Event Upset (SEU) events.

2. The DLL as in claim 1, further comprising a phase detector coupled to receive the reference clock signal and the feedback clock signal, the phase detector deriving the phase detect signal by measuring a phase difference between the reference clock and feedback clock signals.

3. The DLL as in claim 2, wherein the phase detector comprises latches coupled together in a voting scheme so as to prevent Single Event Upset (SEU) events.

4. The DLL as in claim 1, wherein the DLL is coupled with a π-phase detect signal, the π-phase detect signal indicating when the feedback clock signal is lagging the reference clock signal by a phase that is an odd multiple of π.

5. The DLL as in claim 1, wherein the DLL produces a lock detect signal, the lock detect signal indicating that the output signal is at a correct phase.

6. The DLL as in claim 1, wherein the control module is coupled with a delay select signal, the delay select signal having a signal that represents a programmed delay time, and the control module increasing the value of the output select signal by the programmed delay time.

7. The DLL as in claim 1, wherein the phase detect, feedback select, and output select signals comprise at least two phase components.

8. The DLL as in claim 7, wherein the phase detect and feedback select signals comprise zero-phase and 2π-phase components, and the output select signal comprises zero-phase and π/2-phase components.

9. The DLL as in claim 8, wherein the control module comprises a logic circuit, the logic circuit performing a mathematical operation that calculates the π/2-phase component of the output select signal.

10. The DLL as in claim 9, wherein the phase detect signal further comprises up and down components, the up and down components determining the signal value of the feedback select and output select signals.

11. The DLL as in claim 9, wherein the logic circuit comprises intercoupled adders.

12. The DLL as in claim 9, wherein the zero-phase component of the output select signal determines, via the second multiplexer, the first output signal, and the π/2-phase component of the output select signal determines, via the second multiplexer, a second output signal.

13. The DLL as in claim 12, further comprising a first inverter coupled with the first output signal and a second inverter coupled with the second output signal, the first inverter producing a third output signal and the second inverter producing a fourth output signal.

14. A method of delaying a signal with a Delay Locked Loop (DLL), the method comprising:
   providing a phase detect signal from a phase detector to a control module, wherein the phase detector comprises latches coupled together in a voting scheme so as to prevent Single Event Upset (SEU) events; the phase detect signal represents a measure of a phase difference between a reference clock signal and a feedback clock signal;
   deriving, via the control module, an offset select signal and an output select signal;
   providing the reference clock signal to a delay line, the delay line providing a plurality of signal taps, each signal tap providing a distinct delay time, the delay line, thereby, providing a plurality of selectable reference signals;
   providing a feedback select signal to a first multiplexer and the output select signal to a second multiplexer;
   with the first multiplexer, selecting, via the feedback select signal, a first selected reference signal from the plurality of selectable reference signals, the first multiplexer outputting the first selected reference signal as the feedback clock signal; and
   with the second multiplexer, selecting, via the output select signal, a second selected reference signal from the plurality of selectable reference signals, the second multiplexer outputting the second selected reference signal as an output signal of the DLL.

15. The method of claim 14, further comprising providing the reference clock signal and the feedback clock signal to a phase detector, the phase detector producing the phase detect signal.

16. The method of claim 15, further comprising isolating the phase detect, feedback select, and output select into at least two phase components.

17. The method of claim 16, further comprising performing mathematical calculations with a logic circuit coupled to receive the at least two phase components of a first selected feedback signal, the logic circuit outputting a phase component of the output select signal.

18. The method of claim 14, further comprising coupling a delay select signal with the control module so as to program a desired phase delay of the output signal.

19. A method of delaying a signal within a Delay Locked Loop (DLL), the method comprising:
   deriving first and second feedback signals from a reference signal, the first and second feedback signals having different phases; and
   coupling the first and second feedback signals with a logic circuit, the logic circuit producing an output signal based on mathematical operations performed with the first and second feedback signals by the logic circuit, wherein the output signal is derived by performing the mathematical operations represented by the formula $$\phi\left(\frac{\pi}{2}\right) = \frac{(\phi(2\pi) + 3\phi(0))}{4}$$

where $$\phi\left(\frac{\pi}{2}\right)$$

is the output signal, $\phi(2\pi)$ is the second feedback signal, and $\phi(0)$ is the first feedback signal, and wherein a multiplexer is coupled to receive the output signal at a select input, the multiplexer selecting, via the output select signal, a delay of the reference signal.

* * * * *